United States Patent
Cai et al.

(10) Patent No.: US 8,482,921 B2
(45) Date of Patent: Jul. 9, 2013

(54) HEAT SPREADER WITH HIGH HEAT FLUX AND HIGH THERMAL CONDUCTIVITY

(75) Inventors: Qingjun Cai, Newbury Park, CA (US); Chung-Lung Chen, Thousand Oaks, CA (US); Chialun Tsai, Thousand Oaks, CA (US)

(73) Assignee: Teledyne Scientific & Imaging, LLC., Thousand Oaks, CA (US)

( * ) Notice: Subject to any disclaimer, the term of this patent is extended or adjusted under 35 U.S.C. 154(b) by 281 days.

(21) Appl. No.: 12/946,788

(22) Filed: Nov. 15, 2010

(65) Prior Publication Data

US 2011/0284188 A1    Nov. 24, 2011

Related U.S. Application Data

(63) Continuation-in-part of application No. 11/977,251, filed on Oct. 23, 2007, now abandoned.

(60) Provisional application No. 60/854,007, filed on Oct. 23, 2006.

(51) Int. Cl.
*H05K 7/20* (2006.01)

(52) U.S. Cl.
USPC .......... 361/700; 361/699; 361/704; 165/80.4; 165/104.26

(58) Field of Classification Search
None
See application file for complete search history.

(56) References Cited

U.S. PATENT DOCUMENTS

| | | | |
|---|---|---|---|
| 4,106,188 A | 8/1978 | Sekhon et al. | |
| 4,602,679 A | 7/1986 | Edelstein et al. | |
| 4,697,205 A | 9/1987 | Eastman | |
| 5,002,122 A | 3/1991 | Sarraf et al. | |
| 6,302,192 B1 * | 10/2001 | Dussinger et al. | 165/104.26 |
| 6,650,544 B1 * | 11/2003 | Lai | 361/700 |
| 6,864,571 B2 | 3/2005 | Arik et al. | |
| 6,901,994 B1 * | 6/2005 | Jin-Cherng et al. | 165/104.26 |
| 6,945,317 B2 * | 9/2005 | Garner et al. | 165/104.26 |
| 6,997,245 B2 | 2/2006 | Lindemuth et al. | |
| 7,002,247 B2 * | 2/2006 | Mok et al. | 257/713 |
| 7,028,759 B2 | 4/2006 | Rosenfeld | |
| 7,180,179 B2 | 2/2007 | Mok et al. | |
| 7,237,337 B2 * | 7/2007 | Yeh et al. | 29/890.032 |
| 7,246,655 B2 | 7/2007 | Mochizuki et al. | |
| 7,538,422 B2 * | 5/2009 | Dangelo et al. | 257/706 |
| 7,609,520 B2 * | 10/2009 | Chang et al. | 361/700 |
| 7,900,692 B2 * | 3/2011 | Miyahara | 165/104.26 |
| 7,913,748 B2 * | 3/2011 | Lin et al. | 165/104.26 |
| 2005/0126766 A1 | 6/2005 | Lee et al. | |
| 2005/0145367 A1 | 7/2005 | Hannah et al. | |
| 2005/0238810 A1 | 10/2005 | Scaringe et al. | |
| 2006/0011336 A1 * | 1/2006 | Frul | 165/185 |

(Continued)

OTHER PUBLICATIONS

Ciric, Ljiljana V, Non-final Office action mailed Dec. 21, 2011 for U.S. Appl. No. 11/960,480 (citing US Patno. 7,028,759).

(Continued)

*Primary Examiner* — Boris Chervinsky
(74) *Attorney, Agent, or Firm* — Brooks Acordia IP Law, PC

(57) ABSTRACT

A system and method is disclosed for fabricating a heat spreader system, including providing a plurality of bottom microporous wicks recessed in a bottom substrate, bonding a center substrate to the bottom substrate, and bonding a top substrate having a top chamber portion to the center substrate to establish a first vapor chamber with said plurality of bottom microporous wicks.

12 Claims, 8 Drawing Sheets

U.S. PATENT DOCUMENTS

| | | |
|---|---|---|
| 2006/0196640 A1 | 9/2006 | Siu |
| 2007/0068654 A1 | 3/2007 | Chang |
| 2007/0099311 A1 | 5/2007 | Zhou et al. |
| 2007/0158052 A1 | 7/2007 | Lin |
| 2008/0174963 A1 | 7/2008 | Chang et al. |
| 2009/0085198 A1 | 4/2009 | Vadakkanmaruveedu et al. |
| 2009/0159242 A1 | 6/2009 | Zhao et al. |

OTHER PUBLICATIONS

Peterson, G.A., "An Introduction to Heat Pipes", John Wiley & Sons, Inc., Ch 1, p. 1-9; Ch 3, p. 44-49; Ch 4, p. 98-99; Ch 7, p. 241-259 (1994).

Zhao, Y & Chen, C.L., An Experimental Investigation of a High Performance Vapor Chamber for High Heat Flux Applications, Abstract, ASME Submittal (Jul. 2007).

Zhao, Yuan and Chen, Chung-Lung, "An Investigation of Evaporation Heat Transfer in Sintered Copper Wicks With Microgrooves", International Mechanical Engineering Congress (11-.

Sauciuc, et al., "Spreading in the Heat Sink Base: Phase Change Systems or Solid Metals", IEEE Trans. on Components and Packaging Technologies, vol. 25, No. 4, Dec. 2002.

Lee, "How to Select a Heat Sink", Electronics Cooling magazine, Jun. 1995, available online at: http://electronics-cooling.com/articles/1995/jun/jun95_01.php.

Gillot, et al., "Silicon Heat Pipes Used as Thermal Spreaders", IEEE Trans. on Components and Packaging Technologies, vol. 26, No. 2, pp. 332-339, Jun. 2003.

Ponnappan, "A Novel Micro-Capillary Groove-Wick Miniature Heat Pipe", Energy Conversion Engineering Conference and Exhibit 2000, 35th Intersociety, vol. 2, pp. 818-826, July.

Lai, et al., "Thermal Characterization of Flat Silicon Heat Pipes", 20th Annual IEEE Semiconductor Thermal Measurement and Management Symposium, pp. 21-25, Mar. 9-11, 2004.

U.S. Appl. No. 11/977,251, Aug. 27, 2010, Advisory Action.
U.S. Appl. No. 11/977,251, Aug. 16, 2010, Amendment Ater Final.
U.S. Appl. No. 11/977,251, Jun. 14, 2010 Final Office Action.
U.S. Appl. No. 11/977,251, Apr. 26, 2010 Amendment after non-final rejection.
U.S. Appl. No. 11/977,251, Jan. 25, 2010, Non-Final Rejection.
U.S. Appl. No. 11/977,251, Jan. 8, 2010, Amendment entered with RCE.
U.S. Appl. No. 11/977,251, Aug. 11, 2009, Final Rejection.
U.S. Appl. No. 11/977,251, Jun. 5, 2009, Amendment after non-final rejection.
U.S. Appl. No. 11/977,251, Mar. 5, 2009, non-final Rejection.

* cited by examiner

HEAT SPREADER WITH HIGH HEAT FLUX AND HIGH THERMAL CONDUCTIVITY

CROSS REFERENCE TO RELATED APPLICATIONS

This is a Continuation-In-Part of patent application Ser. No. 11/977,251, filed Oct. 23, 2007, now abandoned which claims benefit of Provisional application Ser. No. 60/854,007, filed Oct. 23, 2006.

GOVERNMENT RIGHTS

This invention was made with Government support under Contract No. 71309 awarded by the Defense Advanced Research Projects Agency (DARPA). The Government has certain rights in this invention.

BACKGROUND OF THE INVENTION

This invention is concerned with techniques for thermal management of electronic devices and more particularly with high heat flux cooling technology for microelectronic systems.

Both the performance reliability and life expectancy of electronic equipment are inversely related to the component temperature of the equipment, with a reduction in the temperature corresponding to an exponential increase in the reliability and life expectancy of the device. Therefore, long life and reliable performance of a component may be achieved by effectively controlling the device operating temperature within the design limits for the device. One of the primary devices employed for heat dissipation in microelectronic systems is a heat sink, which absorbs and dissipates heat from a microelectronic device using thermal contact, either direct or radiant. The heat sink is typically a metal structure in contact with the electronic component's hot surface, though in most cases a thin thermal interface material mediates between the two surfaces. Microprocessors and power handling semiconductors are examples of electronics that need a heat sink to reduce their temperature through increased thermal mass and heat dissipation, primarily by conduction and convection and, to a lesser extent, by radiation.

Heat sinks function by efficiently transferring thermal energy from an object at a relatively high temperature to a second object that is at a relatively lower temperature and that has a much greater heat capacity. The goal is to effect a rapid transfer of thermal energy that quickly brings the high temperature object into thermal equilibrium with the low temperature object. Efficient functioning of a heat sink relies on the transfer of thermal energy from the first object to the heat sink at a high rate and from the heat sink to the second object. The high thermal conductivity of the heat sink material, combined with its large surface area (often provided by an array of comb or fin like protrusions), results in the rapid transfer of thermal energy to the surrounding cooler air. Fluids (such as refrigerated coolants) and thermally efficient interface materials can ensure good transfer of thermal energy to the heat sink. Similarly, a fan may improve the transfer of thermal energy from the heat sink to the air.

Heat sink performance, by mechanisms including free convection, forced convection, and liquid cooling, is a function of material, geometry, and the overall surface heat transfer coefficient. Generally, forced convection heat sink thermal performance is improved by increasing the thermal conductivity of the heat sink materials, increasing the surface area (usually by adding extended surfaces, such as fins or foamed metal) and by increasing the overall area heat transfer coefficient (usually by increasing the fluid velocity, by adding fans, coolant pumps, etc.). In addition, heat sinks may be constructed of multiple components exhibiting desirable characteristics, such as phase change materials, which can store a great deal of energy due to their heat of fusion.

When the microelectronic device is substantially smaller than the base plate of a heat sink, there is an additional thermal resistance, called the spreading resistance, which needs to be considered. Performance figures generally assume that the heat to be removed is evenly distributed over the entire base area of the heat sink and thus do not account for the additional temperature rise caused by a smaller heat source. This spreading resistance could typically be 5 to 30% of the total heat sink resistance.

Heat pipes are another useful tool that in the thermal management of microelectronics. A heat pipe can transport large quantities of heat between hot and cold regions with a very small difference in temperature. A typical heat pipe consists of a sealed hollow tube made of a thermoconductive metal such as copper or aluminum. The pipe contains a relatively small quantity of a working fluid, such as water, ethanol or mercury, with the remainder of the pipe being filled with the vapor phase of the working fluid. The advantage of heat pipes is their great efficiency in transferring heat.

The demands made on the thermal management of microelectronic systems are increasing with smaller form factors, elevated power requirements and increased bandwidth being established for next generation electronic systems. High power density, wide bandgap technology, for example, exhibits an extremely high heat flux at the device level. In addition, composite structures have low thermal mass and are not effective conductors of heat to heat sinks. The design of low cost COTS (commercial off the shelf) electronics frequently increases heat dissipation, and modern electronics is often packaged with multiple heat sources located close together. Some systems have local hot spots in particular areas, which induce thermal stress and create performance degrading issues.

These changes are resulting in an increase in the average power density, as well as higher localized power density (hot spots). As a result, the dissipation power density (waste heat flux) of electronic devices has reached several kwatts/cm$^2$ at the chip level and is projected to grow much higher in future devices. Management of such power densities is beyond the capability of traditional cooling techniques, such as a fan blowing air through a heat sink. Indeed, these power densities even exceed the performance limits of more advanced heat removal techniques, such as a liquid coolant flowing through a cold plate. A common practice to address heat spreading issues is to adopt highly conductive bulk materials or to incorporate a heat pipe as the heat spreader. These approaches, however, involve heavy components, the thermal conductivity may be too low, mechanical strength can be a limiting factor, and the heat flux may be too low. Consequently, some new electronic devices are reaching the point of being thermally limited. As a result, without higher performance thermal management systems, such devices may be hampered by being forced to operate at part of their duty cycle or at a lower power level.

Improvements are needed to increase the heat transfer coefficient, as well as to reduce the spreading resistance, primarily in the base of the heat sink. Advanced high heat flux liquid cooling technologies, based on phase change heat transfer, are needed to satisfy requirements for compact, light weight, low cost, and reliable thermal management systems.

BRIEF SUMMARY OF THE INVENTION

A method for assembling a heat spreader system is disclosed that includes providing a plurality of bottom microporous wicks recessed in a bottom substrate, bonding a center substrate to the bottom substrate, and bonding a top substrate having a top chamber portion to the center substrate so that a first vapor chamber is established with the plurality of bottom microporous wicks.

A heat spreader apparatus is disclosed that includes a bottom substrate having a first plurality of recessed microporous wicks, a center substrate bonded to the bottom substrate, and a top substrate bonded to the center substrate, the top substrate having a top chamber portion to establish a first vapor chamber with said first plurality of recessed microporous wicks.

DETAILED DESCRIPTION OF THE INVENTION

Figure 1:
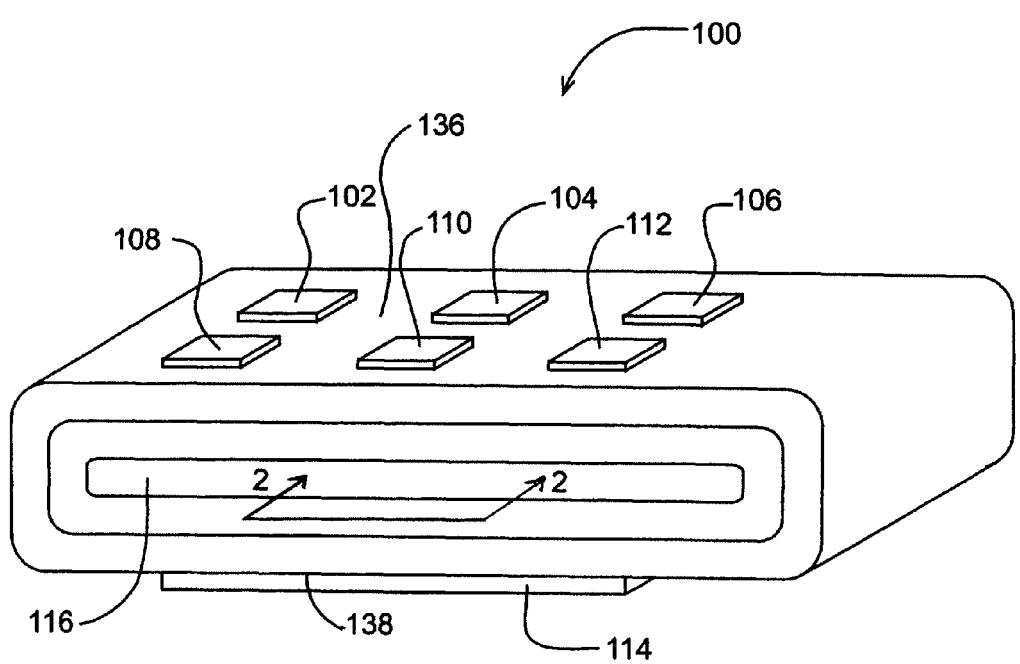
FIG. 1 is a perspective view depicting a heat spreader constructed according to the invention.

FIG. 1 is a perspective view depicting a heat spreader constructed according to this invention. The heat spreader 100 transfers heat from a heat source, such as the microelectronic circuit components 102, 104, 106, 108, 110, and 112, to a heat sink 114, using a phase change coolant, which is contained, in both vapor and liquid forms, in a cavity 116.

Figure 2:
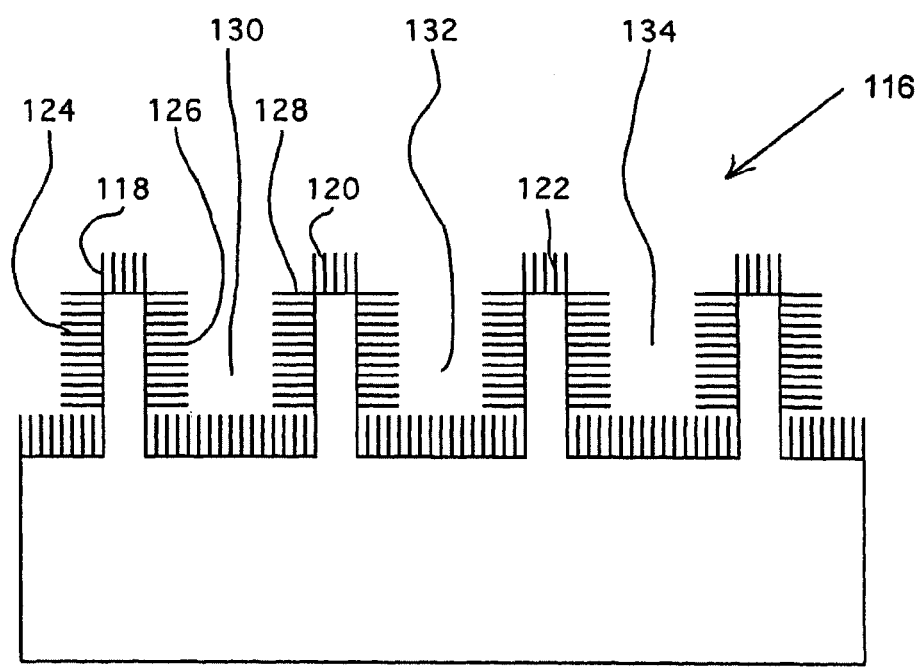
FIG. 2 is a cross sectional, enlarged view of a portion of the cavity depicted in the heat spreader of FIG. 1, along the line 2-2.
Figure 3:
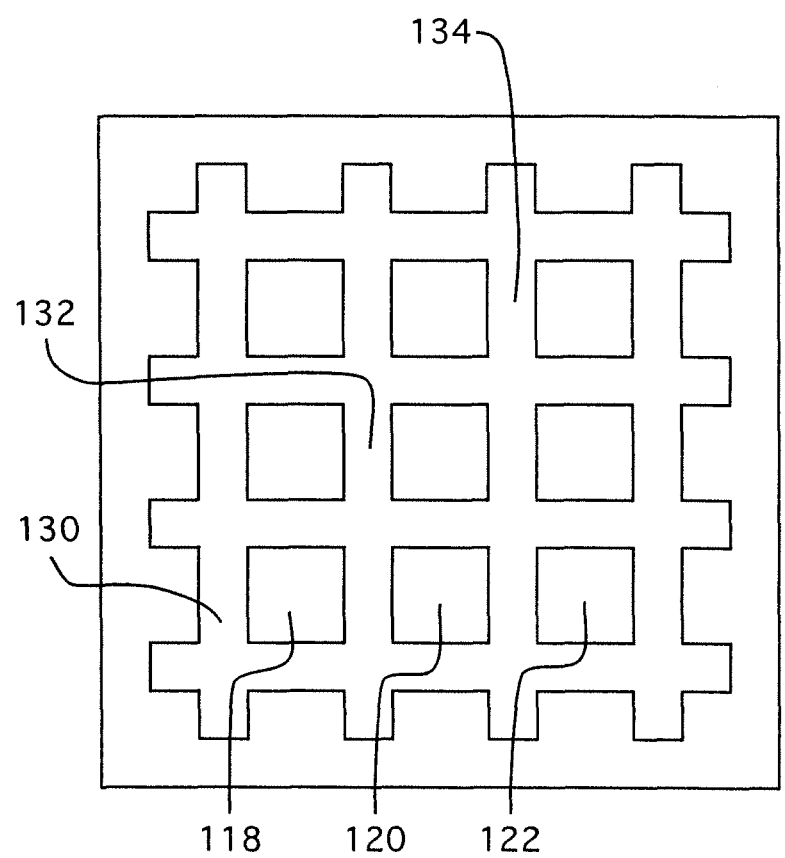
FIG. 3 is a plan view of the portion of the cavity shown in FIG. 2.

As depicted by FIG. 2, which is a cross sectional enlarged view of a portion of the heat spreader 100, and by FIG. 3, which is a plan view of the portion of the heat spreader shown in FIG. 2, surrounding the cavity 116 of the heat spreader, which is the primary location for flow of the coolant in vapor form, multiple microporous wicks, such as, for example, the wicks 118, 120, and 122, and the wicks 124, 126, and 128, support flows of the coolant in the liquid phase, via capillary action, from the heat sink to the source.

In addition, the cavity includes multiple macroporous wicks, such as, for example, the wicks 130, 132, and 134, to support flows of the coolant, in both the liquid and vapor phases, including liquid/vapor mixtures, from the source to the heat sink.

In one embodiment, the microporous wicks are microporous nanotube wicks and, in particular, may be microporous carbon nanotube wicks. Carbon nanotube wicks are typically individually grown in the spreader in areas near the heat source or attached to the macrowicks in such areas. Moreover, as depicted in FIG. 1, in a typical application, the heat spreader will be configured to be positioned between a substantially planar surface 136 of the heat source (See 102, 104, 106, 108, 110, 112) and a substantially planar surface 138 of the heat sink 114, with the heat source and heat sink surfaces being substantially parallel to each other.

The nanotube wicks may be oriented substantially perpendicular to the planar surfaces, as depicted by the wicks 118, 120, and 122, or the wicks may be oriented substantially parallel to the planar surfaces, as depicted by the wicks 124, 126, and 128. Alternatively, the wicks may include, as in the embodiment depicted in FIGS. 2 and 3, both perpendicular and parallel wicks.

In more particular embodiments of the heat spreader, the effective pore size of the microporous wicks is very small, with a high flow resistance, and will range between approximately 10 nm and 1,000 nm in radius. This provides a high capillary pressure for liquid pumping. Microporous nanotube wicks, when grown on an internal surface of the heat spreader, will typically range in height from approximately 100 to 2,000 microns. The microwicks will preferably be connected to the macrowicks to provide a continuous supply route for liquid coolant. When the microwicks are attached to the macrowicks, the microwicks will typically range in height from 1 to 1,000 microns. The pore size of the macroporous wicks will range between approximately 1 and 500 microns.

Figure 4:
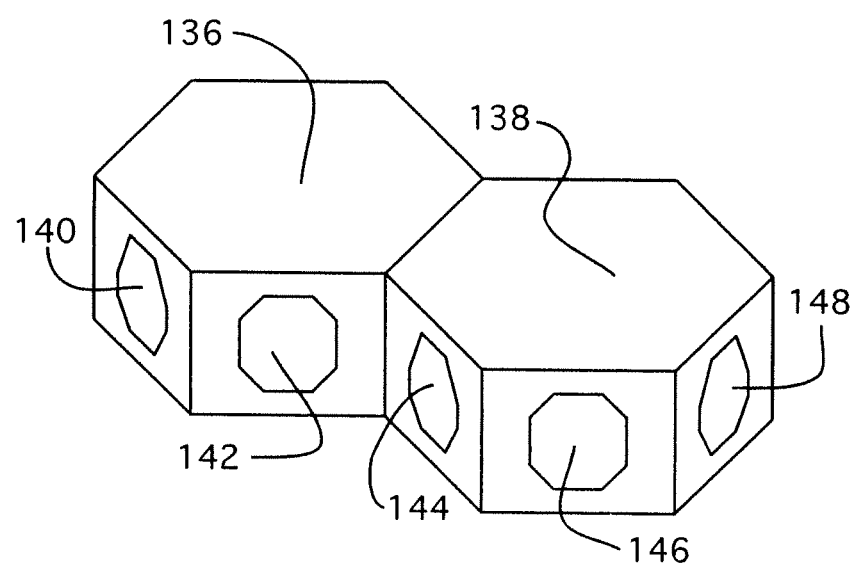
FIG. 4 is a perspective view showing a support structure, for the heat spreader of the invention, made up of interconnecting cells.

The heat spreader may include, in addition, support structure for positioning the spreader between substantially planar surfaces of the heat source and the heat sink. This embodiment is depicted in FIG. 4, which is a perspective view showing a support structure made up of interconnecting cells, with cells 136 and 138 shown. In one embodiment, this support structure is fabricated out of silicon, or can be made from metal materials. Each cell includes multiple macroporous wicks, such as the wicks 140 and 142 in cell 136, as well as the wicks 144, 146, and 148 in cell 138.

Each cell made of silicon or metal materials may include, in one approach to fabrication, an upper piece and a lower piece, symmetrical in geometry. Both the upper and lower pieces could be gold bonded, then reinforced by epoxy poured into a pre-etched cavity. The heat spreader structure can be, for example, a non-metallic material, such as silicon, SiC or SiNa, or a metallic material, such as copper, aluminum or silver. For a non-metallic structure, the fabrication process would typically use a dry or wet etch MEMS (microelectromechanical system) process. For a metallic structure, fabrication process would typically employ the sintering of metal particles.

The macroporous wicks establish passageways that extend through the cellular support structure in a direction substantially parallel to the planar surfaces. Although the scale of FIG. 4 is too small to properly represent them, the interior surfaces of the cells 136 and 138 also contain microporous wicks, similar to the microporous wicks depicted in FIGS. 2 and 3.

As shown in FIG. 4, in one embodiment the cells making up the support structure are hexagonal in cross section, although as those skilled in the pertinent art will appreciate, other geometric shapes for the cells, such as, for example, a triangular cross section, may be possible and desirable for particular applications of the heat spreader. In this two phase cell design, each cell is coated with bi-wick structures made of both macroparticles and nanoparticles.

Only a very small amount of liquid coolant is needed, to cover the wick structure. The cavity is primarily occupied by saturated coolant vapor. The macroparticles incorporate relatively large pores, to reduce pressure losses in the liquid flow attributable to viscosity, while the microwicks generate large capillary forces to circulate the liquid coolant within the spreader, without the need for an external pump.

The phase change involves the absorption and release of a large amount of latent heat at the evaporation and condensation regions of the spreader. With the proper sizing of components, this allows the heat spreader of this invention to operate with no net rise in temperature. This mechanism, which is the cornerstone of modern heat pipe technology, is very efficient for heat transfer. The incorporation of nanotechnology in this invention allows heat pipe technology to advance to a new level of performance and to be integrated into a multifunctional structural material, making possible a significant increase in the thermal mass of composite structures.

Figure 5:
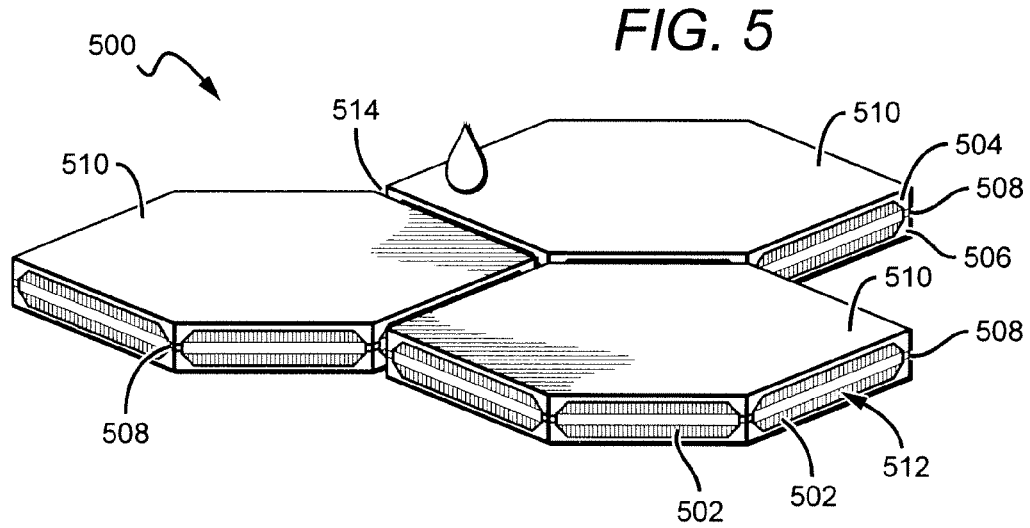
FIG. 5 is a perspective view showing another embodiment of a support structure, for the heat spreader of the invention, made of up interconnecting cells.

FIG. 5 is a perspective view of one embodiment of a support structure of a heat spreader for use between substantial planer surfaces of the heat source and the heat sink. The heat spreader 500, illustrated in FIG. 5 the form of multiple hexcells or "cells", has vapor chamber side ports 502 etched into top and bottom substrates 504, 506 and center substrates 508. The vapor chamber side ports 502 enable vapor communication between adjacent coupled cells 510. In one embodiment, exterior side surfaces 512 of each vapor chamber side port 502 are metalized for introduction of a solder (or glass frit) and for a subsequent heating step to bond adjacent cells 510. A bonding gap 514 is provided between each cell 510 to enable introduction of the solder during assembly. For purposes of this description, heat spreader 500 is illustrated with vapor side ports 502 exposed along its outer perimeter, although in actual use vapor chamber side ports would only be formed between coupled cells 510 to maintain a closed-system heater spreader.

Figure 6:
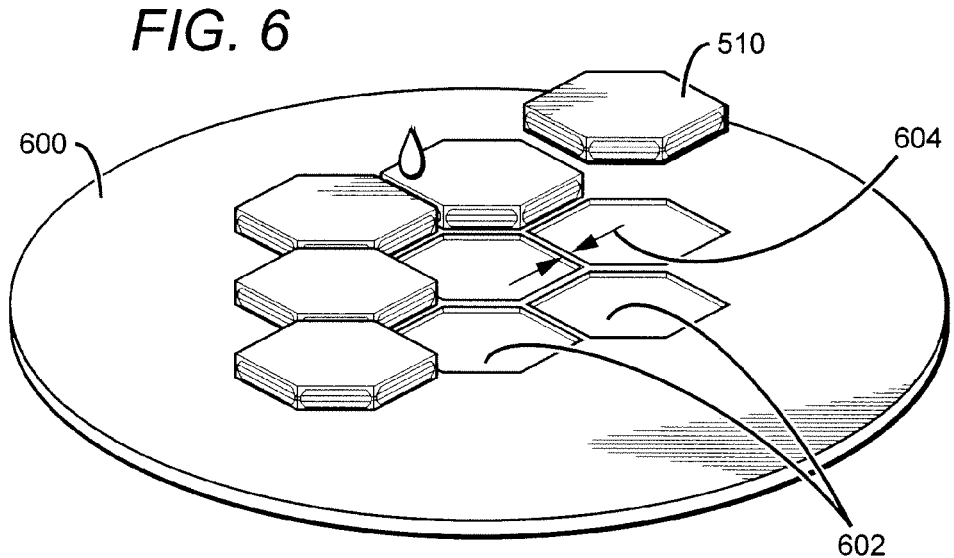
FIG. 6 is a perspective view showing one embodiment of a silicon wafer matrix for facilitating fabrication of the support structure illustrated in FIG. 5.

In one embodiment of a wafer matrix used in the fabrication process of the multi-cell heat spreader, FIG. 6 illustrates a plurality of hexcell traps 602 that are etched or otherwise provided into a wafer, such as a silicon wafer, to position respective hexcells 510 for further fabrication steps. The hexcell traps 602 are preferably etched adjacent one another and recessed into the wafer 600 to partially seat each cell 510, with each cell 510 spaced apart by a bonding gap distance 604 to enable introduction of solder between adjacent cells 510 and in support of a heating step to bond adjacent cells 510. Although illustrated as hexcells, the hexcell traps 602 are configured to receive the shape and dimensions of the cells 510 that may be fabricated in other predetermined shapes, such as squares or rectangles, such as the heat spreader 100 illustrated in FIG. 1.

Figure 7:
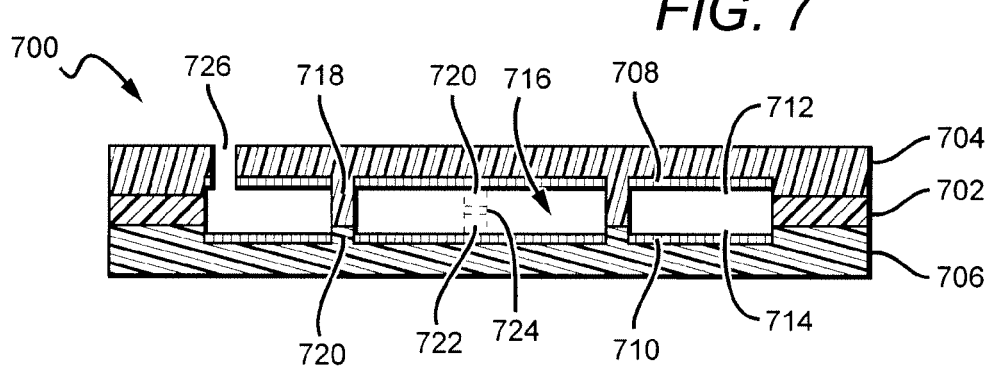
FIG. 7 is a cross section view showing a triple-stack heat spreader in accordance with one embodiment of the invention.

In one embodiment of a square heat spreader 700 illustrated in FIG. 7, a center substrate 702 is bonded between top and bottom substrates (704, 706). Each of the top and bottom substrates preferably has a plurality of recessed microporous wicks, such as etched microporous silicon or microporous parallel nanotube wicks (708, 710). The top substrate 704 has a top chamber portion in complementary opposition to a bottom chamber portion 714 in the bottom substrate 706 to collectively define a vapor chamber 716. A top substrate pillar 718 is preferably formed from the top substrate 704 and is bonded to a lower substrate pillar 720 extending from the lower substrate 706 to provide structural support for the heat spreader 700. In an alternative embodiment, top and bottom substrate pillars (720, 722) have a center substrate pillar 724 bonded between them. Although illustrated as a separate structure from the center substrate 702, the center substrate pillar is preferably formed from the center substrate 702 as described more fully, below. The center substrate 702 and center substrate pillar 724 are preferably glass, such as borosilicate glass, bonded between top and bottom substrates (704, 706) using an anodic-bonding technique. However, the center substrate may be silicon and bonded to top and bottom substrates using a glass frit bonding process.

A fill port 726 is preferably etched through the top substrate 704 to enable charging of the vapor chamber with a fluid. In an alternative embodiment, the fill port 726 may be etched through at an outer perimeter of the top substrate 704, with the fill port extending into the center substrate 702 that has been previously etched through to the vapor chamber 716 for presentation of a fluid to the interior of the heat spreader for charging.

Figure 8:
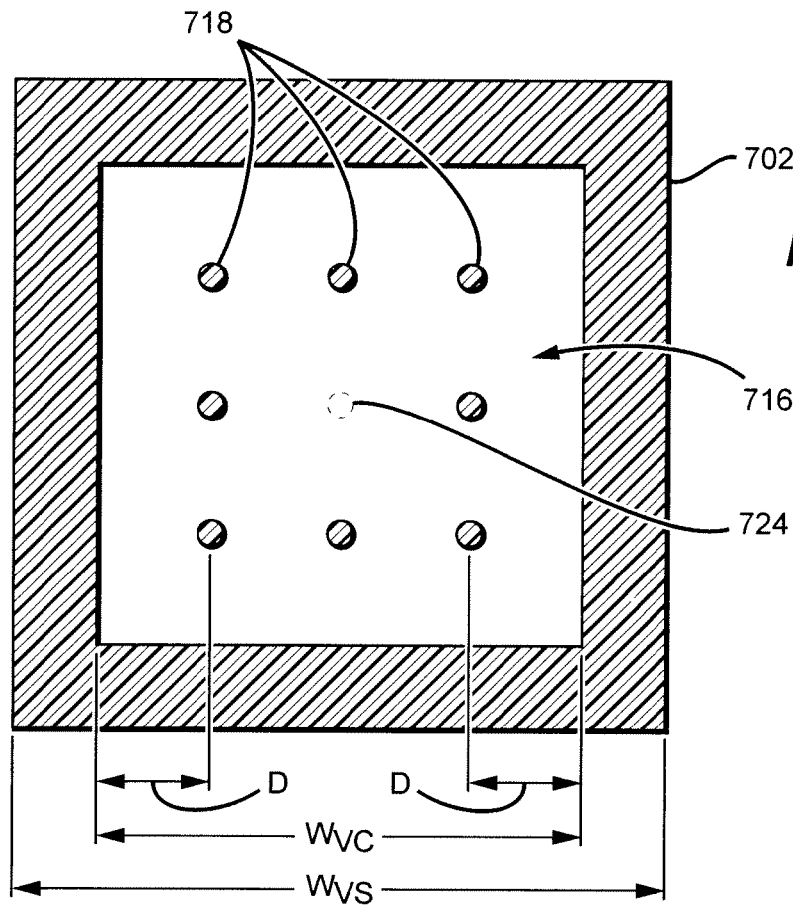
FIG. 8 is a cut-away plan view of the triple-stack heat spreader illustrated in FIG. 7.
Figure 9:
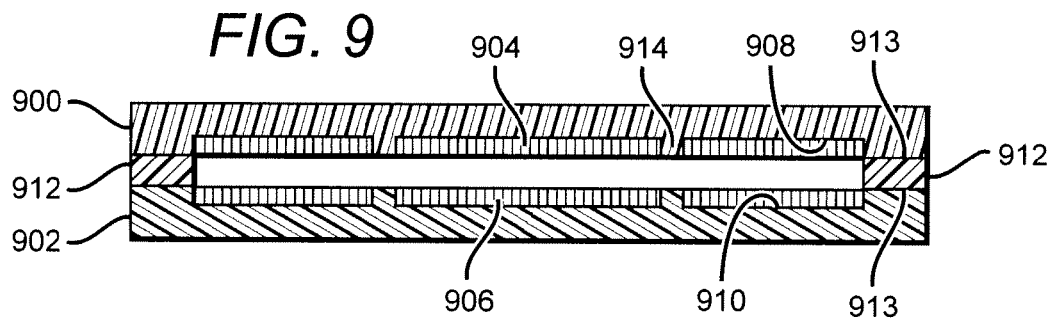
FIGS. 9-13 illustrate fabrication steps for one embodiment of a triple-stack heat spreader.

FIG. 8 is a cross-sectional view of the heat spreader illustrated in FIG. 7, taken through the center substrate 702. The top substrate pillars 718 are formed at a distance D away from an interior edge of the center substrate 702, preferably by 0.75 cm, although 0.1-2.0 cm may be used depending on the total width $W_{VC}$ of the vapor chamber. The center substrate pillar 724 may be formed in the center of the vapor chamber 716 and bonded between the top substrate pillar 720 and bottom substrate pillar 722. The interior width $W_{VC}$ is preferably 3.0 cm, with the outer width of the vapor chamber $W_{VS}$ being 4.0 cm, although the described system is scalable to other dimensions using common wafer fabrication techniques once the overall system configuration is known. Although FIG. 8 illustrates a pattern of equally-spaced top substrate pillars 718, in an alternative embodiment the pillars are formed in a hexagonal, triangular or other pattern to provide appropriate structural support for the heat spreader between top and bottom substrates.

Figure 10:
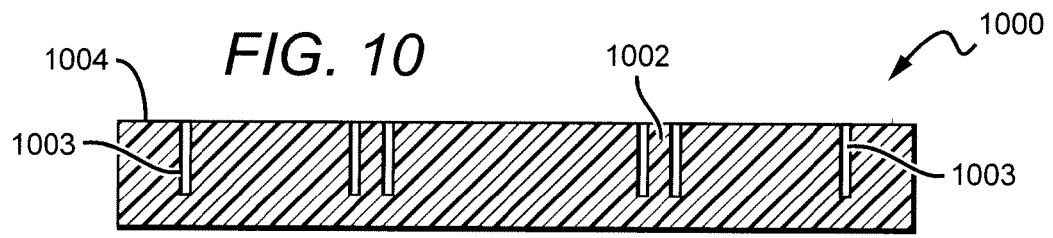

FIGS. 9-13 illustrate one embodiment of a fabrication process for forming a heat spreader system. Top and bottom substrates (900, 902), alternatively referred to as top and bottom wafers, are each provided with a plurality of microporous wicks in top and bottom substrate recesses (908, 910). In a preferred embodiment, the microporous parallel nanotube wicks are carbon nanotube wicks (904, 906) formed by synthesizing and having a diameter of 1.5 mm and height of 250 um carbon nanotube clusters. Or, other wicks may be used, such as etched porous silicon on both top and bottom substrates. In one embodiment, a silicon center substrate 912 may be glass frit bonded, preferably using the glass frit described in Table 1, between the bottom substrate 902 and the top substrate 900 to establish a vapor chamber. In a preferred embodiment such as illustrated in FIG. 10, a silicon center substrate 1000 having a 1.5 mm thickness is preferably first provided with a center substrate post 1002, such as by etching, and a channel 1003 is etched around an outer perimeter of the center substrate 1000 to define a first center substrate bonding surface 1004. A glass frit, preferably the glass frit described in Table 1 (below), is screen printed on the bottom wafer 902 on the first center substrate bonding surface 1004, dried in an oven and fired in a furnace to burn the matrix and pre-fuse the glass patterns.

Figure 11:
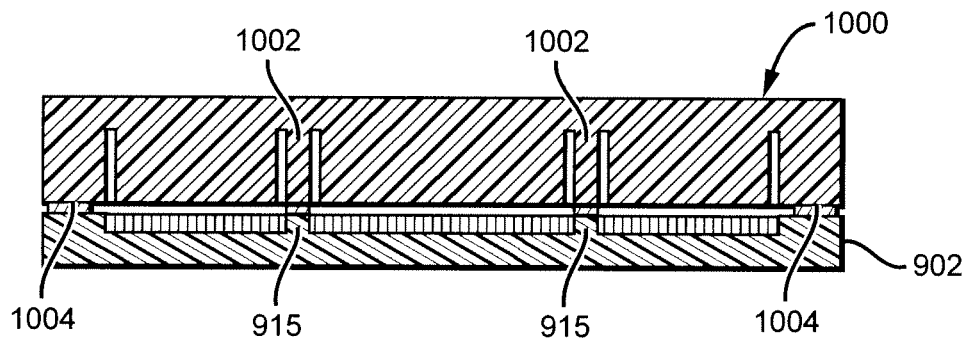
Figure 12:
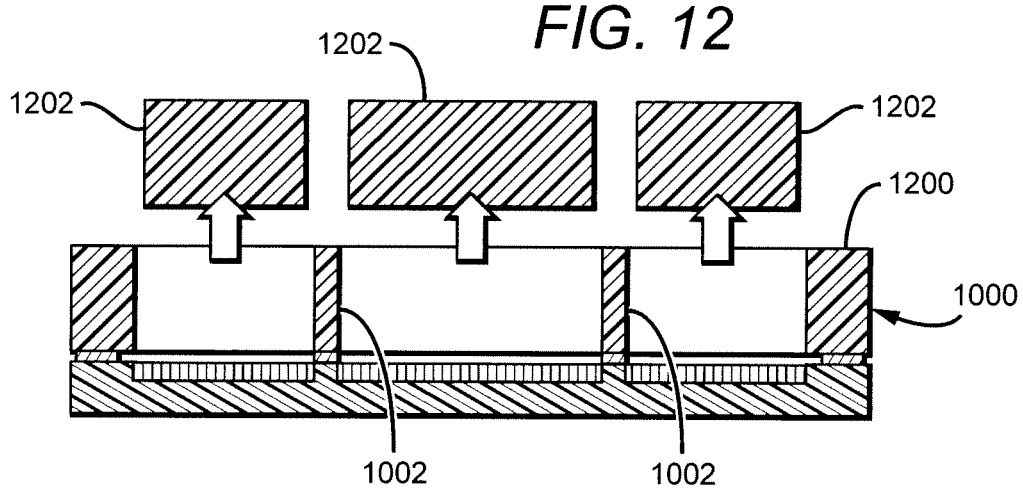
Figure 13:
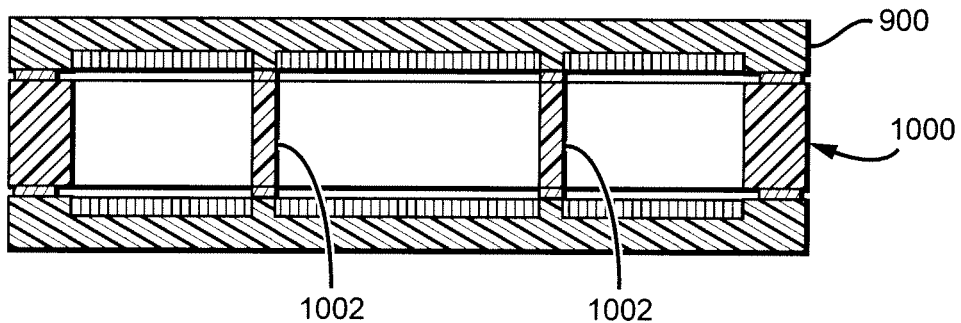

In FIG. 11, the center substrate 1000 has been flipped in orientation and bonded to bottom wafer 902 at the first center substrate bonding surface 1004 and between the center substrate post 1002 and the bottom substrate pillar 915 by applying a suitable temperature-time-pressure cycle under vacuum as understood by one of ordinary skill in the art. In FIG. 12, the center substrate 1000 is etched again but through a second surface 1200 of the center wafer 1000 to free the center substrate post 1002 by removing the remainder of the center wafer 1202 from the heat spreader. In FIG. 13, the top substrate 900 screen printed with the glass frit, dried and fired to remove the matrix and pre-fuse the glass patterns. The top substrate 900 is then is then bonded to the center substrate 1000 and center substrate posts 1002 through the top substrate pillar through suitable application of temperature-time pressure cycle under vacuum.

In one heat spreader designed for use with a glass center substrate (preferably borosilicate glass) and silicon top and bottom substrates, the Frit has the compositions described in Table 1.

TABLE 1

|  | PbO | MgO | $Al_2O_3$ | $SiO_2$ | ZnO | $B_2O_3$ |
|---|---|---|---|---|---|---|
| Matrix | 77 | 1 | 2 | 6 | 3 | 11 |
| Glass | 20 | 11 | 25 | 44 | — | — |

Figure 14:
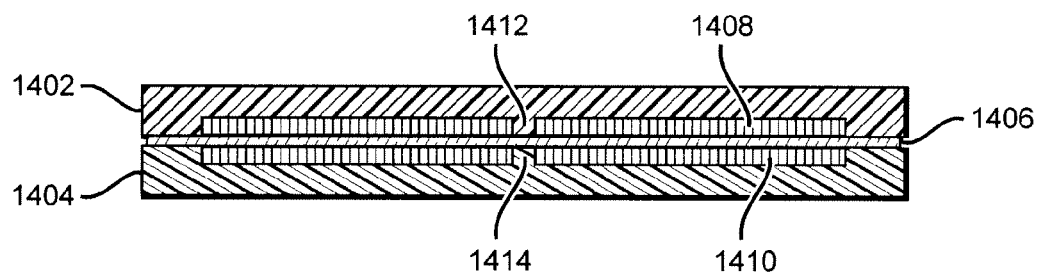
FIG. 14 is a cross section view showing one embodiment of a triple-stack heat spreader that has a glass center layer.
Figure 15:
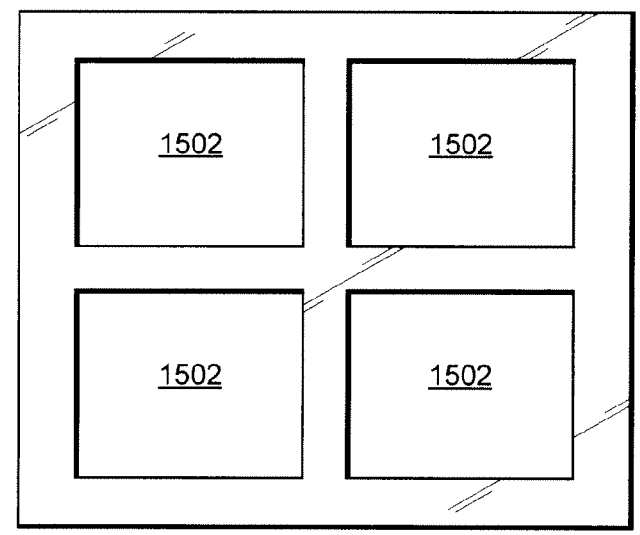
FIG. 15 is a cut-away plan view of the glass center layer illustrated in FIG. 14.

FIGS. 14 and 15 illustrate another embodiment of a heat spreader that has a glass center substrate rather than a silicon center substrate. Top and bottom substrates (1402, 1404) have a glass center layer 1406 coupled between them, preferably with coupled with a glass frit bonding technique. In this embodiment, the glass layer has been precut such as through the use of an ultrasonic knife to have cut through portions 1502 to enable vapor transport between an upper and lower plurality of microporous wicks such as microporous parallel nanotube wicks (1408, 1410). The center substrate glass layer 1406 is also bonded between top and bottom substrate pillars (1412, 1414) extending from the top substrate and bottom substrate, respectively (1402, 1404). In alternative embodiments, there may be more or fewer cut-through portions 1502. Also, although only single top and bottom substrate pillars (1412, 1414) are illustrated, the heat spreader may be provided with a plurality of substrate pillars with the center substrate glass layer 1406 coupled between them. In an alternative embodiment, the center layer may be a third silicon substrate layer, with or without etched cut-through portions. In such a case, diffusion bonding may be used to bond the center substrate between top and bottom substrates.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

We claim:

1. A heat spreader apparatus, comprising:
  a bottom substrate having a first plurality of recessed microporous wicks;
  a center substrate bonded to said bottom substrate; and
  a top substrate bonded to said center substrate, said top substrate having a top chamber portion to establish a first vapor chamber with said first plurality of recessed microporous wicks;
  wherein a first vapor chamber side port is formed in said bottom substrate, said center substrate and said top substrate to enable vapor communication into said first vapor chamber.

2. The apparatus of claim 1, wherein said center substrate comprises glass.

3. The apparatus of claim 1, wherein said center substrate comprises silicon.

4. The apparatus of claim 1, wherein said bottom substrate comprises:
  at least one bottom substrate pillar recessed in said bottom substrate.

5. The apparatus of claim 4, wherein said top substrate comprises:
  at least one top substrate pillar recessed in said top substrate.

6. The apparatus of claim 5, wherein said at least one bottom substrate pillar is bonded to said at least one top substrate pillar.

7. The apparatus of claim 5, further comprising at least one center substrate pillar bonded between said at least one bottom substrate pillar and said at least one top substrate pillar.

8. The apparatus of claim 5, wherein said center substrate is bonded between said at least one bottom substrate pillar and said at least one top substrate pillar.

9. The apparatus of claim 1, wherein said top substrate further comprises:
  a fill port to charge an interior of said heat spreader apparatus with a fluid.

10. The apparatus of claim 1, further comprising:
  a second bottom substrate having a second plurality of recessed microporous wicks;
  a second center substrate bonded to said bottom substrate;
  a second top substrate bonded to said second center substrate, said second top substrate having a second top chamber portion to establish a second vapor chamber with said second plurality of recessed microporous wicks; and
  a second vapor chamber side port formed in said second bottom substrate, said second center substrate and said second top substrate and aligned with said first vapor chamber side port to enable vapor communication between said first vapor chamber and said second vapor chamber.

11. The apparatus of claim 10, wherein said first and second bottom substrates are coupled together and said first and second top substrates are coupled together with said first and second vapor chamber side ports in complementary opposition to enable vapor communication between said first and second vapor chambers.

12. The apparatus of claim 10, further comprising:
  a wafer matrix having a plurality of hexcell traps to seat said first and second bottom substrates for proper alignment of said first and second bottom substrates for bonding.

* * * * *